(12) United States Patent
Brolin et al.

(10) Patent No.: US 8,289,858 B2
(45) Date of Patent: Oct. 16, 2012

(54) ONU DELAY AND JITTER MEASUREMENT

(75) Inventors: Stephen J. Brolin, Livingston, NJ (US); Virgil Vladescu, Hillsdale, NJ (US)

(73) Assignee: Fujitsu Limited, Kawasaki (JP)

( * ) Notice: Subject to any disclaimer, the term of this patent is extended or adjusted under 35 U.S.C. 154(b) by 254 days.

(21) Appl. No.: 11/637,023

(22) Filed: Dec. 12, 2006

(65) Prior Publication Data
US 2007/0133424 A1   Jun. 14, 2007

Related U.S. Application Data

(60) Provisional application No. 60/749,577, filed on Dec. 13, 2005.

(51) Int. Cl.
*G01R 31/08* (2006.01)
(52) U.S. Cl. ........ 370/249; 370/250; 370/252; 370/392; 398/208; 398/16
(58) Field of Classification Search ............. 370/279, 370/250, 252, 392; 398/208, 16
See application file for complete search history.

(56) References Cited

U.S. PATENT DOCUMENTS

| | | | |
|---|---|---|---|
| 4,046,193 A | 9/1977 | Dougherty | |
| 4,557,225 A | 12/1985 | Sagues | |
| 4,720,850 A | 1/1988 | Oberlander | |
| 4,858,069 A | 8/1989 | Hughes | |
| 5,105,336 A | 4/1992 | Jacoby | |
| 5,280,191 A | 1/1994 | Chang | |
| 5,636,215 A | 6/1997 | Kubo | |
| 5,748,445 A | 5/1998 | North | |
| 5,812,373 A | 9/1998 | Hwang | |
| 5,812,528 A * | 9/1998 | VanDervort | 370/235 |
| 5,825,621 A | 10/1998 | Giannatto | |
| 5,829,514 A | 11/1998 | Smith | |
| 5,831,830 A | 11/1998 | Mahler | |
| 5,867,494 A | 2/1999 | Krishnaswamy | |
| 5,867,495 A | 2/1999 | Elliott | |
| 5,953,207 A | 9/1999 | Aakalu | |
| 6,002,585 A | 12/1999 | Leeb | |
| 6,038,129 A | 3/2000 | Falaki | |
| 6,047,002 A | 4/2000 | Hartmann | |
| 6,101,090 A | 8/2000 | Gates | |

(Continued)

FOREIGN PATENT DOCUMENTS

KR   2004063453 A  *  7/2004

OTHER PUBLICATIONS

Gerry Pesavento ("Enabling Next Generation Ethernet Access With Ethernet Passive Optical Networks", National Fiber Optics Engineers Conference, 2003 Technical Proceedings, pp. 494-497).*

(Continued)

*Primary Examiner* — Kibrom T Hailu
(74) *Attorney, Agent, or Firm* — Murphy & King, P.C.

(57) ABSTRACT

A system and method provide measurement of round trip delay and jitter in an optical network without adding cost to the components of the network. A method of determining round-trip delay and jitter in an optical network comprises the steps of a) transmitting a test frame over the optical network to a device on the optical network, b) receiving a looped-back test frame from the device over the optical network, and c) determining a round-trip delay measurement using the received looped-back test frame.

6 Claims, 3 Drawing Sheets

U.S. PATENT DOCUMENTS

| | | | |
|---|---|---|---|
| 6,434,000 | B1 | 8/2002 | Pandolfi |
| 6,532,088 | B1 | 3/2003 | Dantu |
| 6,614,758 | B2 | 9/2003 | Wong |
| 6,621,818 | B1 | 9/2003 | Szczepanek |
| 6,671,818 | B1 | 12/2003 | Mikurak |
| 6,711,013 | B2 | 3/2004 | Wobig |
| 6,789,191 | B1 | 9/2004 | Lapstun |
| 6,805,623 | B2 | 10/2004 | Robison |
| 6,972,959 | B2 | 12/2005 | Asai |
| 6,985,467 | B2 | 1/2006 | Lomp et al. |
| 7,020,111 | B2 | 3/2006 | Ozluturk et al. |
| 7,046,679 | B2 | 5/2006 | Sampath |
| 7,085,281 | B2 | 8/2006 | Thomas et al. |
| 7,095,611 | B2 | 8/2006 | Kunz |
| 7,103,807 | B2 | 9/2006 | Bosa |
| 7,124,101 | B1 | 10/2006 | Mikurak |
| 7,133,415 | B2 | 11/2006 | Zelig |
| 7,154,755 | B2 | 12/2006 | Araujo |
| 7,158,380 | B2 | 1/2007 | Green |
| 7,245,628 | B2 | 7/2007 | Shi et al. |
| 7,277,443 | B2 | 10/2007 | Goode |
| 7,283,519 | B2 | 10/2007 | Girard |
| 7,322,850 | B2 | 1/2008 | Neer |
| 7,376,136 | B2 * | 5/2008 | Song et al. ............... 370/392 |
| 7,403,477 | B2 | 7/2008 | Takeuchi |
| 7,428,211 | B2 | 9/2008 | Yu |
| 7,492,719 | B2 * | 2/2009 | Lim et al. ............... 370/241.1 |
| 7,512,147 | B2 | 3/2009 | Sato |
| 7,599,620 | B2 | 10/2009 | Graves |
| 2002/0059637 | A1 | 5/2002 | Rakib |
| 2002/0085548 | A1 | 7/2002 | Ku |
| 2002/0141159 | A1 | 10/2002 | Bloemen |
| 2002/0196792 | A1 | 12/2002 | McNeil |
| 2002/0196811 | A1 | 12/2002 | Park |
| 2003/0026074 | A1 | 2/2003 | Clements |
| 2003/0050002 | A1 | 3/2003 | Pfister |
| 2003/0091267 | A1 | 5/2003 | Alvarez |
| 2004/0007348 | A1 | 1/2004 | Stoller |
| 2004/0064351 | A1 | 4/2004 | Mikurak |
| 2004/0107169 | A1 | 6/2004 | Lowe |
| 2004/0177161 | A1 | 9/2004 | Hoang |
| 2004/0190548 | A1 | 9/2004 | Harel |
| 2004/0202470 | A1 | 10/2004 | Lim |
| 2005/0008013 | A1 | 1/2005 | Jamieson |
| 2005/0013314 | A1 | 1/2005 | Lim |
| 2005/0099949 | A1 * | 5/2005 | Mohan et al. ............ 370/236.2 |
| 2005/0100015 | A1 | 5/2005 | Eubanks |
| 2005/0180749 | A1 | 8/2005 | Koley |
| 2005/0198247 | A1 | 9/2005 | Perry |
| 2006/0098578 | A1 | 5/2006 | Mallya |
| 2006/0120389 | A1 | 6/2006 | Sampath |
| 2006/0209825 | A1 | 9/2006 | Carroll et al. |
| 2006/0285536 | A1 | 12/2006 | Gerard Pauwels |
| 2007/0025370 | A1 | 2/2007 | Ghasem et al. |
| 2007/0070997 | A1 | 3/2007 | Weitz et al. |
| 2007/0109974 | A1 | 5/2007 | Cutillo et al. |
| 2007/0136743 | A1 | 6/2007 | Hasek |
| 2007/0136777 | A1 | 6/2007 | Hasek |
| 2008/0068807 | A1 | 3/2008 | Horng |

OTHER PUBLICATIONS

International Search Report and a Written Opinion issued on Oct. 31, 2008 in the corresponding International PCT/US2006/047274 application.
Final Office Action dated Mar. 29, 2010 received in U.S. Appl. No. 11/637,041.
Non-Final Office Action dated Feb. 24, 2010 received in U.S. Appl. No. 11/637,808.
Final Office Action dated Feb. 1, 2010 received in U.S. Appl. No. 11/637,807.
Final Office Action dated Sep. 30, 2009 issued in U.S. Appl. No. 11/637,037.
Non-Final Office Action dated Mar. 11, 2009 issued in U.S. Appl. No. 11/637,037.
Non-Final Office Action dated May 5, 2009 issued in U.S. Appl. No. 11/637,808.
Final Office Action dated Oct. 16, 2009 issued in U.S. Appl. No. 11/637,808.
Non-Final Office Action dated Apr. 17, 2008 issued in U.S. Appl. No. 11/637,840.
Notice of Allowance dated Aug. 13, 2008 issued in U.S. Appl. No. 11/637,840.
Non-Final Office Action dated Sep. 16, 2009 issued in U.S. Appl. No. 11/637,807.
Non-Final Office Action dated Jul. 23, 2009 issued in U.S. Appl. No. 11/637,041.
Notice of Allowance dated Nov. 9, 2009 issued in U.S. Appl. No. 11/637,842.
Non-Final Office Action dated May 14, 2009 issued in U.S. Appl. No. 11/637,842.
Non-Final Office Action dated Apr. 2, 2009 issued in U.S. Appl. No. 11/637,807.
Paul Congdon, "Load Balancing Algorithms", Feb. 4, 1998, IEEE Aggregate Study Group, all pages.
IEEE Std 802.3ad-2000, "Aggregation of Multiple Link Segments", Mar. 30, 2000, IEEE, all pages.
Final Office Action dated Mar. 29, 2010 issued in U.S. Appl. No. 11/637,041.
Non-Final Office Action dated Feb. 25, 2010 issued in U.S. Appl. No. 11/637,808.
Final Office Action dated Feb. 1, 2010 issued in U.S. Appl. No. 11/637,807.
Final Office Action dated Jul. 20, 2010 received in U.S. Appl. No. 11/637,808.
International Search Report dated Feb. 19, 2008 received in PCT/US06/47379.
Notice of Allowance dated Jun. 24, 2010 received in U.S. Appl. No. 11/637,037.
Notice of Allowance dated Sep. 23, 2010 received in U.S. Appl. No. 11/637,808.
Non-Final Office Action dated Nov. 10, 2010 received in U.S. Appl. No. 11/637,807.
Notice of Allowance dated Sep. 16, 2010 received in U.S. Appl. No. 11/637,037.
Non-Final Office Action dated Nov. 8, 2010 received in U.S. Appl. No. 11/637,041.
Supplemental Notice of Allowability dated Oct. 19, 2010 received in U.S. Appl. No. 11/637,037.
Notice of Allowance dated Sep. 15, 2011 received in U.S. Appl. No. 11/637,807.
Non-Final Office Action dated Oct. 28, 2011 received in U.S. Appl. No. 11/637,841.
Non-Final Office Action dated Jan. 7, 2011 received in U.S. Appl. No. 11/637,841.
Notice of Allowance dated Mar. 31, 2011 received in U.S. Appl. No. 11/637,041.
Final Office Action dated May 10, 2011 issued in U.S. Appl. No. 11/637,841.
Notice of Allowance dated Jul. 8, 2011 issued in U.S. Appl. No. 11/637,807.
Notice of Allowance dated Jan. 20, 2012 received in U.S. Appl. No. 11/637,807.

* cited by examiner

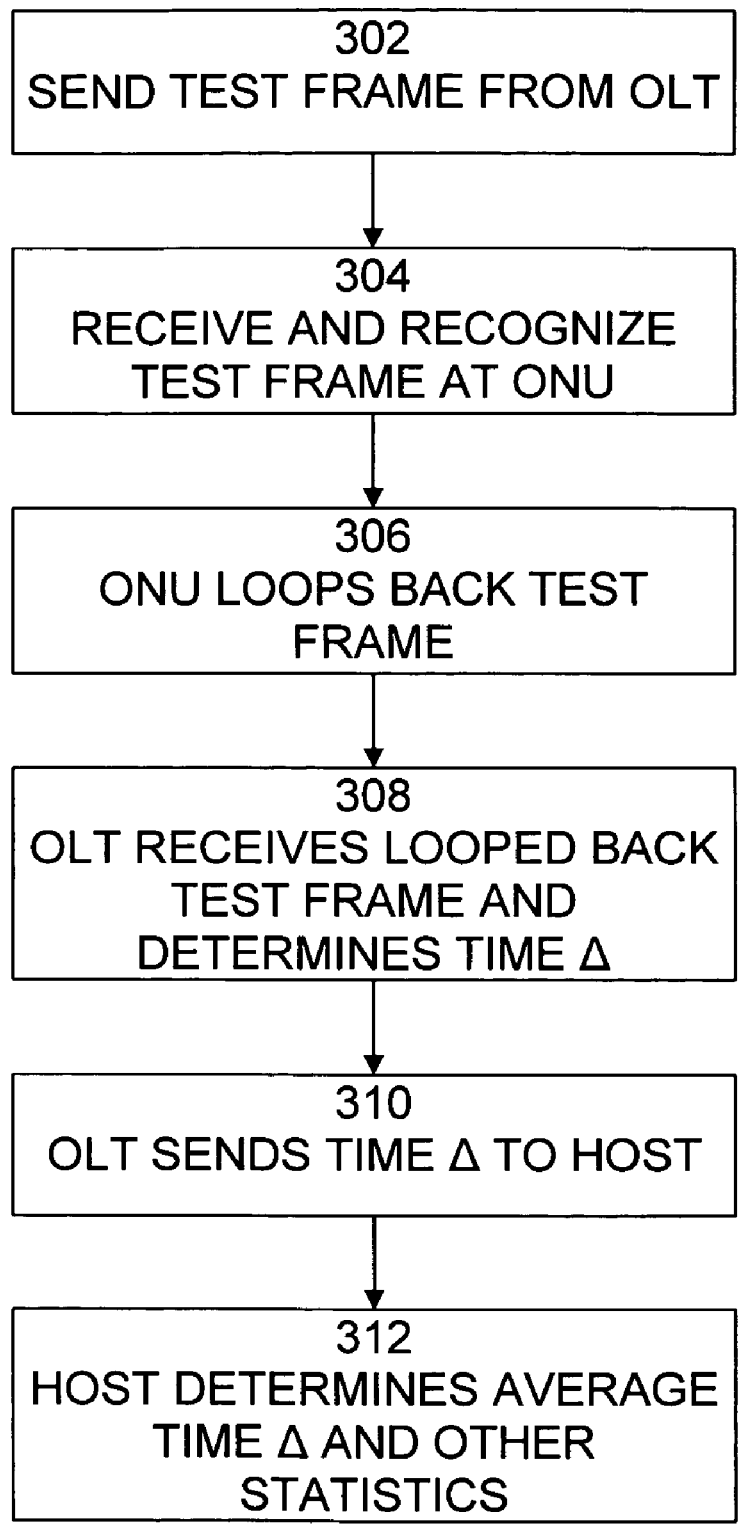

US 8,289,858 B2

ONU DELAY AND JITTER MEASUREMENT

CROSS-REFERENCE TO RELATED APPLICATIONS

This application claims the benefit of provisional application 60/749,577, filed Dec. 13, 2005, the entirety of which is incorporated herein by reference.

BACKGROUND OF THE INVENTION

1. Field of the Invention

The present invention relates to a system and method for measuring round-trip delay and jitter in an optical network.

2. Background of the Prior Art

A Passive Optical Network (PON) is a point-to-multipoint, fiber to the premises network architecture in which unpowered optical splitters are used to enable a single optical fiber to serve multiple premises, typically 32. A PON consists of an Optical Line Termination (OLT) typically at the service provider's central office and a number of Optical Network Units (ONUs) near end users. A PON configuration reduces the amount of fiber and central office equipment required compared with point to point architectures. Downstream signals are broadcast to each premises sharing a fiber. Encryption is used to prevent eavesdropping. Upstream signals are combined using a multiple access protocol, typically time division multiple access (TDMA). The OLTs "range" the ONUs in order to provide time slot assignments for upstream communication and to equalize round trip transmission delays from ONU's on the PON to the OLT There are a number of standard types of PON that have been implemented. APON (ATM Passive Optical Network) was the first Passive optical network standard. It was used primarily for business applications, and was based on ATM. BPON (Broadband PON) is a standard based on APON. It adds support for WDM, dynamic and higher upstream bandwidth allocation, and survivability. GPON (Gigabit PON) is an evolution of BPON. It supports higher rates, enhanced security, and choice of Layer 2 protocol (ATM, GEM, Ethernet). GPON represents a significant boost in both the total bandwidth and bandwidth efficiency through the use of larger, variable-length packets. A GPON network delivers up to 2,488 megabits per second (Mbit/s) of downstream bandwidth, and 2,488 Mbit/s of upstream bandwidth. GPON Encapsulation Method (GEM) allows very efficient packaging of user traffic, with frame segmentation to allow for higher Quality of Service (QoS) for delay-sensitive traffic such as voice and video communications.

In order to verify the quality of transmitted traffic in a GPON, a number of parameters of the network must be measured and reported to network operations center. Among these parameters are the roundtrip delay of packets in the network and the jitter introduced by the network. Although these important parameters must be measured, it is also important to perform the measurements in a cost-effective manner. Therefore, a need arises for a technique that provides accurate measurement of delay and jitter in a GPON, but which does so in a cost-effective manner (primarily by adding very little, if any cost, at the ONU end)

SUMMARY OF THE INVENTION

The present invention provides a system and method for measuring round trip delay and jitter in an optical network without adding cost to the components of the network. A specific GEM flow is looped back in hardware at the ONU. The OLT timestamps a test packet going downstream and measures the time of arrival of the return packet. The difference is sent to the host CPU. Multiple delay samples are collected to compute average delay and min to max delay (peak to peak jitter).

A method of determining round-trip delay and jitter in an optical network comprises the steps of a) transmitting a test frame over the optical network to a device on the optical network, b) receiving a looped-back test frame from the device over the optical network, and c) determining a round-trip delay measurement using the received looped-back test frame. The test frame may comprise a time stamp. The determining step may comprise the step of determining the round-trip delay measurement based on a difference between a time of receipt of the received looped-back test frame and the time stamp in the received looped-back test frame. The method may further comprises the steps of performing a plurality of iterations of steps a)-c) to determine a plurality of round-trip delay measurements, determining a maximum round-trip delay measurement of the plurality of determined round-trip delay measurements, determining a minimum round-trip delay measurement of the plurality of determined round-trip delay measurements, and determining a jitter measurement based on a difference between the maximum round-trip delay measurement and the minimum round-trip delay measurement. The method may be performed in an Optical Line Termination. The device may be an Optical Line Unit. The test frame may be identified by a GPON Encapsulation Method tag. Also—average delay can be computed from the plurality of measurements.

Apparatus for determining round-trip delay and jitter in an optical network comprises a) circuitry operable to transmit a test frame over the optical network to a device on the optical network, b) circuitry operable to receive a looped-back test frame from the device over the optical network, and c) circuitry operable to determine a round-trip delay measurement using the received looped-back test frame. The test frame may comprise a time stamp. The circuitry operable to determine a round-trip delay measurement using the received looped-back test frame may comprise circuitry operable to determine the round-trip delay measurement based on a difference between a time of receipt of the received looped-back test frame and the time stamp in the received looped-back test frame. The apparatus may further comprise circuitry operable to repeatedly operate circuitry a)-c) to determine a plurality of round-trip delay measurements, circuitry operable to determine a maximum round-trip delay measurement of the plurality of determined round-trip delay measurements, circuitry operable to determine a minimum round-trip delay measurement of the plurality of determined round-trip delay measurements, and circuitry operable to determine a jitter measurement based on a difference between the maximum round-trip delay measurement and the minimum round-trip delay measurement. Also, average delay can be calculated from the measurements. The apparatus may be included in an Optical Line Termination. The device may be an Optical Line Unit. The test frame may be identified by a GPON Encapsulation Method tag.

An Optical Network Unit operable with an Optical Line Termination to determine round-trip delay and jitter in an optical network comprises a) circuitry operable to receive and recognize a test frame over the optical network from the Optical Line Termination and b) circuitry operable to loopback the test frame to the Optical Line Termination for determination of the round-trip delay measurement. The test frame may comprise a time stamp. The Optical Line Termination may be operable to determine a round-trip delay measurement using the received looped-back test frame comprises circuitry operable to determine the round-trip delay measurement based on a difference between a time of receipt of the received looped-back test frame and the time stamp in the received looped-back test frame. The Optical Line Termination may be operable to determine a jitter measurement based on a difference between a maximum round-trip delay measurement and a minimum round-trip delay measurement determined from a plurality of round-trip delay measurements. The test frame may be identified at the ONU (and GPON receive circuitry at the OLT) by a GPON Encapsulation Method tag.

BRIEF DESCRIPTION OF THE DRAWINGS

FIG. 3 is an exemplary flow diagram of a measurement process of the present invention.

DETAILED DESCRIPTION OF THE PREFERRED EMBODIMENTS

The present invention provides a system and method for measuring round trip delay and jitter in an optical network without adding cost to the components of the network, specifically the Optical Network Units (ONUs) of the network. A special test frame is sent periodically to all ONU's or a selected subset of ONU's. Each ONU recognizes the special looping GEM tag for that ONU, and hardware loops it back to the Optical Line Termination (OLT). The GEM tag is unique per ONU. It is important to avoid looping in the ONU CPU— to avoid additional delay and uncertainty caused by the software. The OLT hardware receives the looped frame and notes the difference between the time stamp in the received frame and current local time-based on the same local time reference. The OLT hardware sends the ONU ID and the time difference to the local host CPU. The OLT host CPU compiles up to 15 minutes worth of delay samples on same loop back path. The average of these samples is the average round-trip delay. The min to max delay comprises jitter on the round trip delay. Other statistics can be computed such as the 90%, 99% etc point of max and min roundtrip delay. By assigning different test tags, the OLT can move the looping frames to different ONU's compiling an aggregate data base of jitter and delay over all ONU's, as well as ONU specific data in its host CPU.

Figure 1:
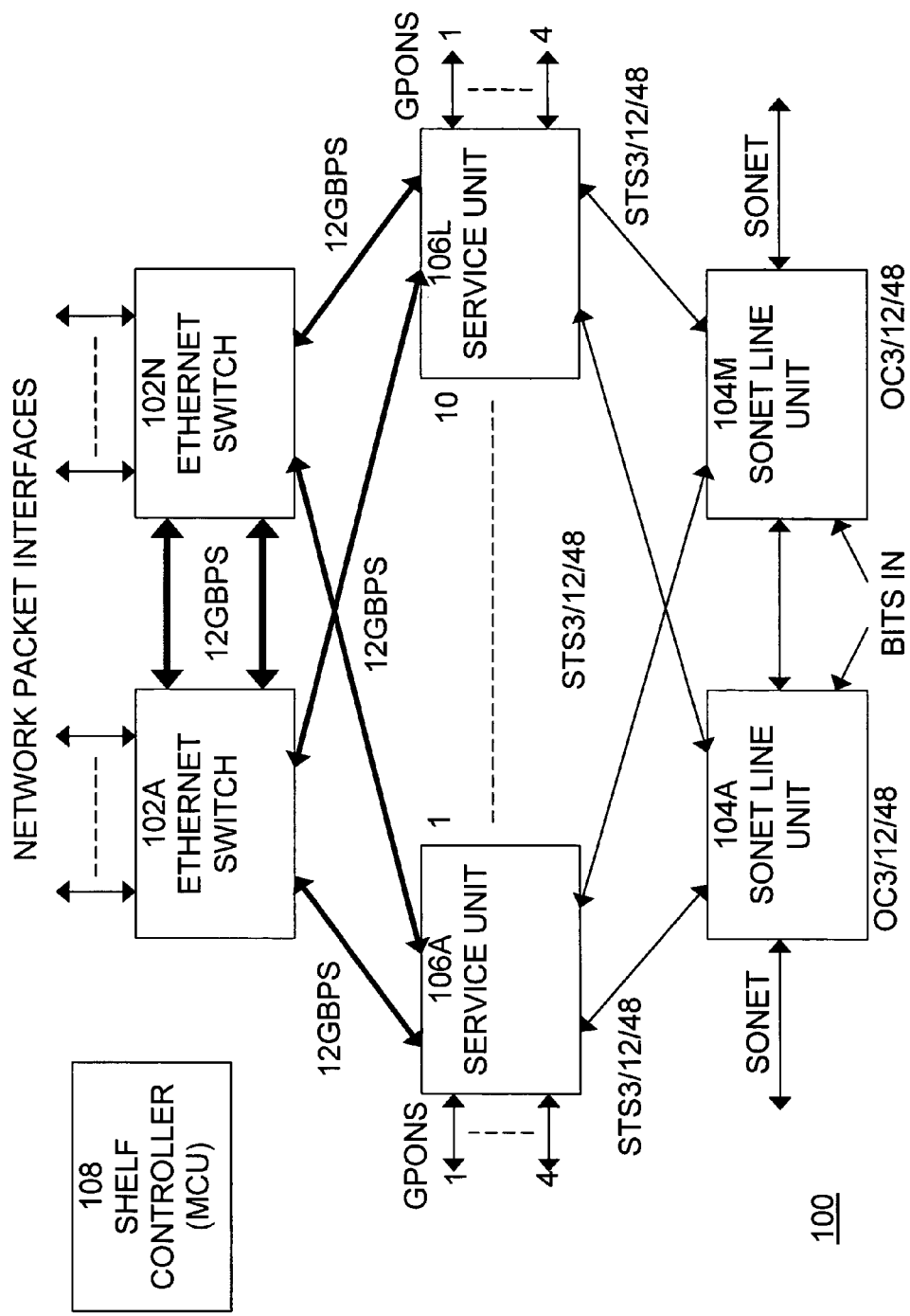
FIG. 1 is an exemplary block diagram of an OLT, in which the present invention may be implemented.

An example of an optical line terminal (OLT) 100, in which the present invention may be implemented, is shown in FIG. 1. OLT 100 includes a plurality of switches, such as Ethernet switches 102A-N, a plurality of SONET line units 104A-M, a plurality of service units 106A-L, and shelf controller 108. The OLT 100 provides the interface between the packet network, (data, video, and telephony networks) and the GPON. The primary function of the OLT 100 is to receive traffic in an IP/Ethernet format and convert it to the GPON format for downstream, and to receive upstream traffic from the GPON and convert it to an IP/Ethernet format. Alternatively, the OLT can also map SONET/SDH into the GPON format for downstream and map GPON to SONET/SDH format for upstream.

A network switch, such as an Ethernet switch 102A-N is a networking device that performs transparent bridging (connection of multiple network segments with forwarding based on MAC and/or VLAN addresses) at full wire speed in hardware. The use of specially designed hardware also makes it possible to have large numbers of ports.

SONET line units 104A-M (LUs), provide communication interface with the SONET network, while service units 106A-L (SUs), provide communication with the GPON networks. Each LU 104A-M typically provides timing control, SONET frame pulse reference, and may contain optical interfaces to transmit part of all of the upstream data on the GPON network to the SONET network, to supplement data fed to the packet network via the OLT from the GPON. Downstream, the OLT can take selected data from the SONET network and selected data from the packet network and map them into GPON's.

Figure 2:
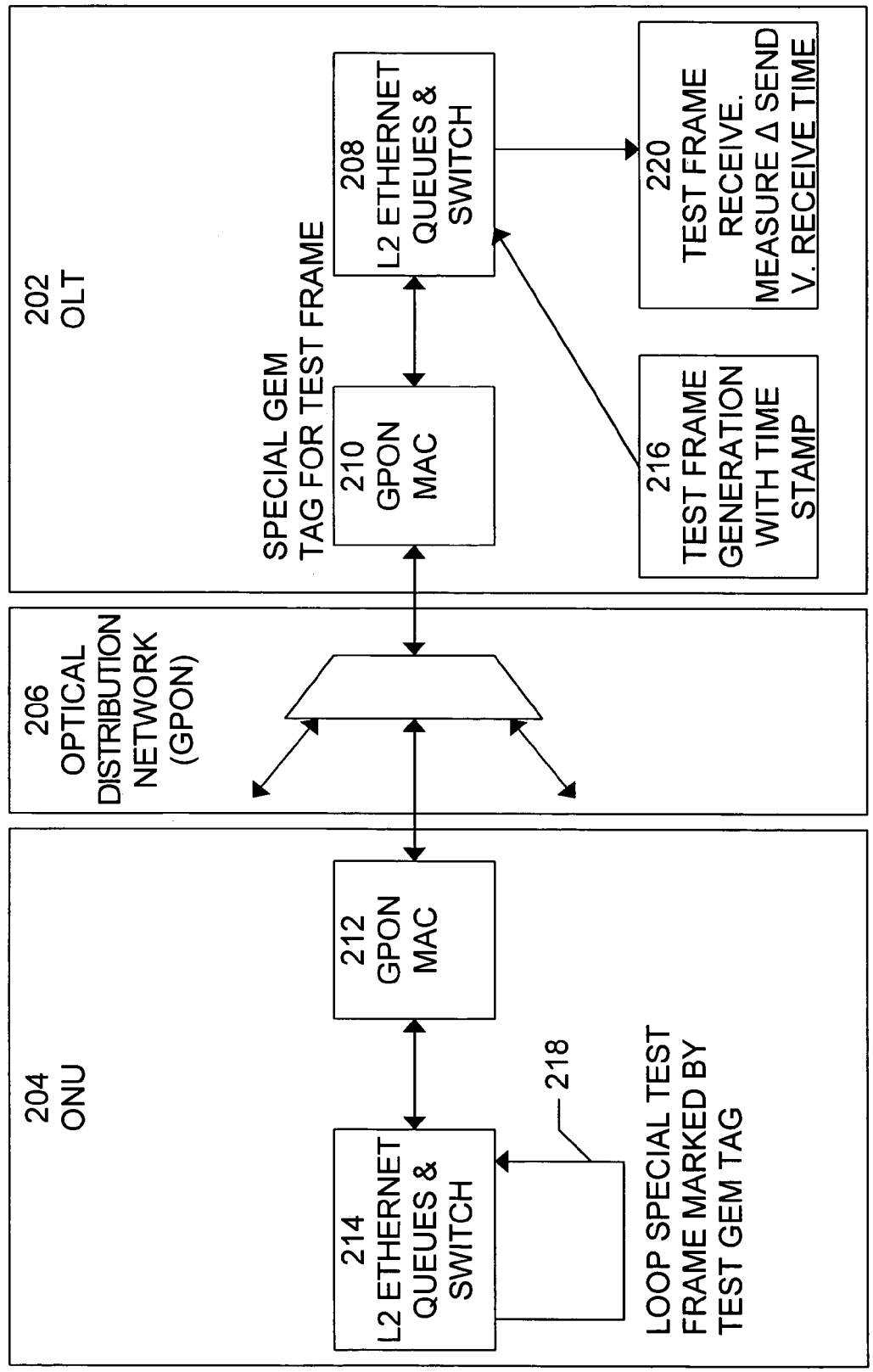
FIG. 2 is an exemplary data flow diagram of the measurement technique of the present invention.

A block diagram of a system 200 in which the present invention may be implemented is shown in FIG. 2. System 200 includes an OLT 202, an ONU 204, and an optical distribution network 206. Optical distribution network 206 is typically a passive optical network, such as a GPON. OLT 202 provides an interface between one or more other distribution networks (not shown) and network 206 and provides an interface for data to be transmitted over the GPON 206. For example, OLT 202 may provide an interface between a SONET network (not shown) and a GPON 206. GPON 206 is typically connected to multiple ONUs 204. The ONU provides the interface between the customer's data, video, and telephony networks (not shown) and the GPON 206. The primary function of the ONU is to receive traffic in an optical format and convert it to the customer's desired format.

In the example shown in FIG. 2, OLT 202 includes one or more Layer 2 (L2) Ethernet queues and switch 208, which handles data traffic between other connected distribution networks (not shown) and GPON 206. Ethernet queues and switch 208 communicates with GPON 206 via GPON Media Access Control block (MAC) 210. The MAC data communication protocol sub-layer is the part of the seven-layer OSI model data link layer (layer 2). It provides addressing and channel access control mechanisms that makes it possible for several terminals or network nodes to communicate within a multipoint network, such as GPON 206. The MAC layer provides addressing (GEM tags) to enable ONU's to receive their data and also assigns upstream timeslots to ONU's in addition to GEM tags. Other services provide by the MAC layer are ranging, encryption, forward error correction, and frame segmentation. The complete description of the GPON MAC layer is described in ITU G.984.

GPON 206 is a point-to-multipoint, fiber to the customer network architecture in which unpowered optical splitters are used to enable a single optical fiber to serve multiple customer locations. A PON configuration reduces the amount of fiber and central office equipment required compared with point to point architectures. Downstream signals are broadcast to each premises sharing a fiber. Encryption is used to prevent eavesdropping. Upstream signals are combined using a multiple access protocol, invariably time division multiple access (TDMA). The OLTs "range" the ONUs in order to provide time slot assignments for upstream communication and equalize ONU to OLT round trip transmission delays. GPON (Gigabit PON) supports higher rates, enhanced security, and choice of Layer 2 protocol (ATM, GEM, Ethernet). It also created a standard management interface, called OMCI, between the OLT and ONU/ONT, enabling mixed-vendor networks.

ONU 204 includes GPON MAC 212 and L2 Ethernet queues and switch 214, which handles data traffic between connected customer networks (not shown) and GPON 206. Ethernet queues and switch 208 communicates with GPON 206 via GPON Media Access Control block (MAC) 210.

A process of delay and jitter measurement using the system 200 shown in FIG. 2 is shown in FIG. 3. It is best viewed in conjunction with FIG. 2. Process 300 begins with step 302, in which a special test frame is sent periodically from OLT 202 to all ONU's or a selected subset of ONU's, such as ONU 204. In particular, test from generation block 216 generates the test frame and transmits it via Ethernet switch 208 (and GPON MAC 210) to the ONUs, such as ONU 204. For example, the test frame may be a minimum size (64 byte) and contain a multi-byte time stamp as part of its payload. The frame is given a special GEM tag to identify it as a test frame. Typically, the GEM tag is unique per ONU. The special packet is identified to that ONU and as a loopback packet via the GEM tag. It is looped in hardware at the ONU, which avoids processing overhead in the ONU, which avoids additional delay and measurement uncertainty.

In step 304, each ONU, such as ONU 204 receives the test frame and recognizes it as a test frame using the special GEM tag. In step 306, ONU 204 loops-back 218 the recognized test frame. Due to this loop-back, there is no requirement for precision time stamping at ONU 204. Likewise, there is no requirement for a precise alignment of time at both ends (sub-millisecond precision).

In step 308, OLT 202 receives the looped-back test frame at block 220 and determines the difference between the time stamp in the received frame and the current local time using on the same local time reference that was used to generate the timestamp in the test frame.

In step 310, OLT 202 transmits the ID of the ONU that was tested and the determined time difference to a local host CPU (not shown). In step 312, the OLT host CPU compiles a number of delay samples (such as 15 minutes worth) on same loop back path. The average of these samples is the average round-trip delay. The difference between the minimum and maximum delays provides a measurement of the jitter on the round trip delay. Other statistics may be computed, such as the 90%, 99%, etc points of minimum and maximum roundtrip delay. The computed statistics may be reported to a network management system as part of performance management data. By only sending the test frame to one or a few ONU's at a time, the hardware complexity at the OLT is minimized.

Although specific embodiments of the present invention have been described, it will be understood by those of skill in the art that there are other embodiments that are equivalent to the described embodiments. Accordingly, it is to be understood that the invention is not to be limited by the specific illustrated embodiments, but only by the scope of the appended claims.

The invention claimed is:

1. A method of determining round-trip delay and jitter in an optical network, comprising the steps of:
   a) transmitting a test frame over the optical network from an Optical Line Termination unit in the optical network to a plurality of Optical Line Units, a plurality of Optical Network Units, or both, in the optical network, each test frame identified by a Gigabit Passive Optical Network ("GPON") Encapsulation Method tag that is unique to each Optical Line Unit or Optical Network Unit and including a time stamp generated by the Optical Line Termination Unit using a time reference of the Optical Line Termination Unit;
   b) receiving, at the Optical Line Termination Unit, a looped-back test frame from each of the plurality of Optical Line Units, the plurality of Optical Network Units, or both, over the optical network, wherein the test frame has been looped-back in data link layer (Layer 2) hardware circuitry that is not a processor, the time references of the plurality of Optical Line Units and the plurality of Optical Network Units are not aligned to the time reference of the Optical Line Termination Unit, and the looped-back test frame was not time-stamped at the ONU; and
   c) determining a round-trip delay measurement based on a difference of the time stamp generated by the Optical Line Termination unit and included in the looped-back test frame and the time the Optical Line Termination unit received the looped-back using the time reference of the Optical Line Termination Unit used to generate the time stamp.

2. The method of claim 1, further comprising the steps of:
   performing a plurality of iterations of steps a)-c) to determine a plurality of round-trip delay measurements;
   determining a maximum round-trip delay measurement of the plurality of determined round-trip delay measurements;
   determining a minimum round-trip delay measurement of the plurality of determined round-trip delay measurements; and
   determining a jitter measurement based on a difference between the maximum round-trip delay measurement and the minimum round-trip delay measurement.

3. Apparatus for determining round-trip delay and jitter in an optical network, comprising:
   a) circuitry in Optical Line Termination unit in the optical network operable to transmit a test frame over the optical network to a plurality of Optical Line Units, a plurality of Optical Network Units, or both, in the optical network, each test frame identified by a Gigabit Passive Optical Network ("GPON") Encapsulation Method tag that is unique to each Optical Line Unit or Optical Network Unit and including a time stamp generated by the Optical Line Termination Unit using a time reference of the Optical Line Termination Unit;
   b) circuitry in the Optical Line Termination Unit operable to receive a looped-back test frame from each of the plurality of Optical Line Units, the plurality of Optical Network Units, or both, over the optical network, wherein the test frame has been looped-back in data link layer (Layer 2) hardware circuitry that is not a processor, the time references of the plurality of Optical Line Units and the plurality of Optical Network Units are not aligned to the time reference of the Optical Line Termination Unit, and the looped-back test frame was not time-stamped at the ONU; and
   c) circuitry operable to determine a round-trip delay measurement based on a difference of the time stamp generated by the Optical Line Termination unit and included in the looped-back test frame and the time the Optical Line Termination unit received the looped-back using the time reference of the Optical Line Termination Unit used to generate the time stamp.

4. The apparatus of claim 3, further comprising:
   circuitry operable to repeatedly operate circuitry a)-c) to determine a plurality of round-trip delay measurements;
   circuitry operable to determine a maximum round-trip delay measurement of the plurality of determined round-trip delay measurements;
   circuitry operable to determine a minimum round-trip delay measurement of the plurality of determined round-trip delay measurements; and
   circuitry operable to determine a jitter measurement based on a difference between the maximum round-trip delay measurement and the minimum round-trip delay measurement.

5. An Optical Network Unit operable with an Optical Line Termination unit to determine round-trip delay and jitter in an optical network, comprising:
  a) circuitry operable to receive and recognize a test frame over the optical network from the Optical Line Termination unit, each test frame identified by a Gigabit Passive Optical Network ("GPON") Encapsulation Method tag that is unique to each Optical Line Unit or Optical Network Unit and including a time stamp generated by the Optical Line Termination Unit using a time reference of the Optical Line Termination Unit; and
  b) circuitry operable to loop-back in data link layer (Layer 2) hardware circuitry that is not a processor the test frame to each of the plurality of Optical Line Units, Optical Network Units, or both, for determination of the round-trip delay measurement based on a difference of the time stamp generated by the Optical Line Termination unit and included in the looped-back test frame and the time the Optical Line Termination unit received the looped-back using the time reference of the Optical Line Termination Unit used to generate the time stamp, wherein the time references of the plurality of Optical Line Units and the plurality of Optical Network Units are not aligned to the time reference of the Optical Line Termination Unit, and the looped-back test frame was not time-stamped at the ONU.

6. The Unit of claim 5, wherein the Optical Line Termination is operable to determine a jitter measurement based on a difference between a maximum round-trip delay measurement and a minimum round-trip delay measurement determined from a plurality of round-trip delay measurements.

* * * * *